(12) United States Patent
Tanigawa et al.

(10) Patent No.: US 8,907,626 B2
(45) Date of Patent: Dec. 9, 2014

(54) BATTERY PACK CONTROL APPARATUS

(75) Inventors: Keisuke Tanigawa, Nishio (JP); Takumi Shimizu, Yokkaichi (JP); Tomomichi Mizoguchi, Nagoya (JP); Manabu Sasaki, Toyota (JP); Yoshiaki Kikuchi, Toyota (JP); Ryo Mano, Toyota (JP); Jyunta Izumi, Toyota (JP); Teruo Ishishita, Miyoshi (JP)

(73) Assignees: Denso Corporation, Kariya (JP); Toyota Jidosha Kabushiki Kaisha, Toyota-shi (JP)

( * ) Notice: Subject to any disclaimer, the term of this patent is extended or adjusted under 35 U.S.C. 154(b) by 434 days.

(21) Appl. No.: 13/499,084

(22) PCT Filed: Sep. 28, 2010

(86) PCT No.: PCT/JP2010/066851
§ 371 (c)(1),
(2), (4) Date: Mar. 29, 2012

(87) PCT Pub. No.: WO2011/040412
PCT Pub. Date: Apr. 7, 2011

(65) Prior Publication Data
US 2012/0187908 A1 Jul. 26, 2012

(30) Foreign Application Priority Data
Sep. 29, 2009 (JP) ................. 2009-224952

(51) Int. Cl.
| | |
|---|---|
| H02J 7/00 | (2006.01) |
| G01R 19/165 | (2006.01) |
| H01M 10/48 | (2006.01) |
| B60L 11/18 | (2006.01) |
| G01R 31/36 | (2006.01) |

(52) U.S. Cl.
CPC ........... *B60L 11/1851* (2013.01); *G01R 31/362* (2013.01); *G01R 19/16542* (2013.01); *H02J 7/0013* (2013.01); *H01M 10/482* (2013.01); *Y02T 10/7055* (2013.01); *Y02T 10/7011* (2013.01); *Y02T 10/705* (2013.01); *H02J 7/0021* (2013.01); *Y02T 10/7005* (2013.01); *H02J 7/0026* (2013.01); *G01R 31/3658* (2013.01)
USPC .......................................... 320/116; 320/134

(58) Field of Classification Search
CPC ............. H02J 7/0031; H02J 2007/004; H02J 2007/0037; Y02E 60/12; H01M 10/48
USPC .......................................................... 320/116
See application file for complete search history.

(56) References Cited

U.S. PATENT DOCUMENTS 7,728,553 B2 * 6/2010 Carrier et al. ................. 320/119
8,334,674 B2 * 12/2012 Kim ............................. 320/124

(Continued)

FOREIGN PATENT DOCUMENTS

| | | |
|---|---|---|
| JP | 2003-092840 | 3/2003 |
| JP | 2005-323459 | 11/2005 |

(Continued)

OTHER PUBLICATIONS

Extended European Search Report (9 pages) dated Nov. 11, 2013, issued in corresponding EP Application No. 10820527.9-1804.
International Search Report for PCT/JP2010/066851, mailed Dec. 14, 2010.

(Continued)

*Primary Examiner* — Arun Williams
(74) *Attorney, Agent, or Firm* — Nixon & Vanderhye P.C.

(57) ABSTRACT

A plurality of voltage switching circuits 41 are provided in a switching unit 40 to relatively change a reference voltage to plural levels, thus detecting a spontaneous change of the reference voltage. A range of relative change in the reference voltage by the plurality of voltage switching circuits 41 is set to a usage voltage range 81 or 82 as a part of a total voltage range 80 of each of cells 1a to 1d. This eliminates the need to provide voltage switching circuits 41 required to relatively change the reference voltage over the total voltage range of each of the cells 1a to 1d, making it possible to minimize the number of the voltage switching circuits 41 for each of the cells 1a to 1d. Thus, it is possible to prevent the size of a battery pack control apparatus 2 from increasing.

17 Claims, 5 Drawing Sheets

(56) References Cited

U.S. PATENT DOCUMENTS

| | | | |
|---|---|---|---|
| 2005/0057219 A1* | 3/2005 | Kaminski et al. | 320/116 |
| 2005/0099155 A1* | 5/2005 | Okuda et al. | 320/107 |
| 2006/0028179 A1 | 2/2006 | Yudahira et al. | |
| 2007/0029124 A1* | 2/2007 | DasGupta et al. | 180/65.3 |
| 2007/0296401 A1* | 12/2007 | Reimund et al. | 324/158.1 |
| 2008/0114501 A1* | 5/2008 | Wu | 701/2 |
| 2008/0170342 A1* | 7/2008 | Osamura | 361/56 |
| 2009/0130542 A1 | 5/2009 | Mizoguchi et al. | |
| 2009/0174411 A1 | 7/2009 | Yudahira et al. | |
| 2011/0074435 A1 | 3/2011 | Mizoguchi | |
| 2012/0001639 A1 | 1/2012 | Mizoguchi et al. | |

FOREIGN PATENT DOCUMENTS

| | | |
|---|---|---|
| JP | 2006-058285 | 3/2006 |
| JP | 2011-078164 | 4/2011 |
| JP | 2011-078165 | 4/2011 |

OTHER PUBLICATIONS

Foreign-language Written Opinion of the International Searching Authority for PCT/JP2010/066851, mailed Dec. 14, 2010.

U.S. Appl. No. 13/206,841, Mizoguchi et al., filed Aug. 10, 2011.

International Preliminary Report on Patentability and Written Opinion for PCT/JP2010/066851, dated Apr. 12, 2012, with English translation, (10 pages).

* cited by examiner

BATTERY PACK CONTROL APPARATUS

This application is the U.S. national phase of International Application No. PCT/JP2010/066851, filed 28 Sep. 2010, which designated the U.S. and claims priority to Japan Application No. 2009-224952, filed 29 Sep. 2009, the entire contents of each of which are hereby incorporated by reference.

TECHNICAL FIELD OF THE INVENTION

The present invention relates to battery pack control apparatuses.

BACKGROUND ART

There are conventionally battery pack control apparatuses with a function of detecting the spontaneous change of a reference voltage for detecting overcharging and/or overdischarging of a battery pack, a battery pack control apparatus of which is proposed in a first patent document as an example.

When comparing the battery voltage with the reference voltage, the battery pack control apparatus alters the reference voltage relative to a specified voltage in one step. Then, the battery pack control apparatus determines that there is a great spontaneous change in the reference voltage when the relation in magnitude of the reference voltage and the voltage of a unit cell is not reversed irrespective of the relative change of the reference voltage. This makes it possible to detect the spontaneous change of the reference voltage.

ART DISCUSSED ABOVE

Patent Document

First patent document: 2003-92840

DISCLOSURE OF THE INVENTION

Problems to be Solved by the Invention

However, the aforementioned conventional art requires a specified voltage as the voltage of a cell when relatively shifting the reference voltage. This may not detect characteristic shift depending on usage status of the battery pack. For this reason, there is a problem with the conventional art; this problem is that the determination of the spontaneous change of the reference voltage has a low reliability.

In view of the above points, the present invention has an object to provide a battery pack control apparatus capable of improving the reliability of determination of spontaneous change of a reference voltage.

Means for Solving the Problems

In order to achieve such a purpose provided above, an embodiment of the invention is a battery pack control apparatus for monitoring a voltage of a plurality of series-connected cells constituting a battery pack. The battery pack control apparatus includes a voltage detecting means that detects a voltage of a cell in the plurality of cells; a reference voltage generating means that generates a reference voltage; a voltage comparing means that compares the voltage of the at least one cell with the reference voltage; a switching means comprising a plurality of voltage switching circuits that relatively change the reference voltage; and a determining means that: determines a state of the battery pack based on a result of the comparison outputted from the voltage comparing means; and determines whether there is a spontaneous change of the reference voltage based on: a result of the comparison between the voltage of the cell detected by the voltage detecting means and the reference voltage; and a result of the comparison by the voltage comparing means while the reference voltage is relatively changed stepwisely by the plurality of voltage switching circuits. A range of relative change in the reference voltage by the plurality of switching circuits is set to a usage voltage range to be used by the cell within a total voltage range of the cell, the total voltage range being defined from a minimum voltage to a maximum voltage of the cell, and the determining means detects the spontaneous change of the reference voltage based on respective results of comparisons between plural levels of the reference voltage stepwisely switched by the plurality of voltage switching circuits and the voltage of the cell.

As described above, because the range of relative change in the reference voltage is limited within a voltage range to be used by the cell, it is possible to minimize the number of the voltage switching circuits to be provided in the switching means. Thus, it is possible to prevent the scale of the battery pack control apparatus from increasing.

In an embodiment of the invention, the range of the relative change in the reference voltage has an upper limit, the upper limit being set to a voltage indicative of overcharging of the cell, and the determining means carries out abnormality determination that the cell is overcharged when the voltage of the at least one cell exceeds the upper limit of the range of the relative change in the reference voltage.

This prevents a fault due to overcharging of the cell, thus improving the safety of the cell.

In an embodiment of the invention, the range of the relative change in the reference voltage has a lower limit, the lower limit being set to a voltage indicative of overdischarging of the at least one cell, and the determining means stops an operation of the at least one cell when determining that the voltage of the at least one cell falls below the lower limit of the range of the relative change in the reference voltage.

Because the operation of the cell is stopped in the case of overdischarging, it is possible to prevent further overdischarging of the cell, thus improving the reliability of the cell.

In an embodiment of the invention, when the reference voltage generating means, the voltage comparing means, and the switching means constitute an overcharging and overdischarging detecting circuit, the overcharging and overdischarging detecting circuit is provided in plurality for one of the plurality of cells.

Because overdischarging of the one cell is monitored by the plurality of overcharging and overdischarging circuits, it is possible to enhance the redundancy of monitoring of overcharging and overdischarging of the cell. Even if the plurality of switching means are provided for the one cell, the range of relative change of the reference voltage is limited to be within a voltage range to be used by the cell. For this reason, the number of the plurality of voltage switching circuits to be provided in each switching means is minimized. Thus, it is possible to prevent the scale of the battery pack control apparatus from increasing even if the redundancy of monitoring of overcharging and overdischarging of the cell is enhanced.

In an embodiment of the invention, the usage voltage range is a range determined within the total voltage range, the range having a voltage with a highest frequency being centered.

This properly determines overcharging and overdischarging for the highest frequently used voltage.

In an embodiment of the invention, the cell is installed in a vehicle able to travel on at least one of drive power outputted from an internal combustion engine and drive power outputted from a driving electric motor, and the usage voltage range to be used by the cell is a range centered on 60% of a fully charged voltage of the at least one cell.

In a vehicle, such as a hybrid vehicle, able to travel on at least one of the drive power outputted from an internal combustion engine and the drive power outputted from a driving electric motor, the frequency of use of a voltage that is 60% or thereabout of the fully charged voltage of the cell. For this reason, the range of relative change in the reference voltage is limited to the range centered on 60% of the fully charged voltage of the cell, thus properly determining overcharging and overdischarging.

In an embodiment of the invention, the cell is installed in a vehicle able to travel on drive power outputted from a driving electric motor, and the usage voltage range to be used by the cell is a range with an upper limit of 80% of a fully charged voltage of the at least one cell.

In a vehicle, such as an electric vehicle, able to travel on the drive power outputted from a driving electric motor, the frequency of use of a voltage that is 80% or thereabout of the fully charged voltage of the cell. For this reason, the range of relative change in the reference voltage is limited to the range with an upper limit of 80% of the fully charged voltage of the cell. This properly determines overcharging and overdischarging.

DESCRIPTION OF EMBODIMENTS

Figure 1:
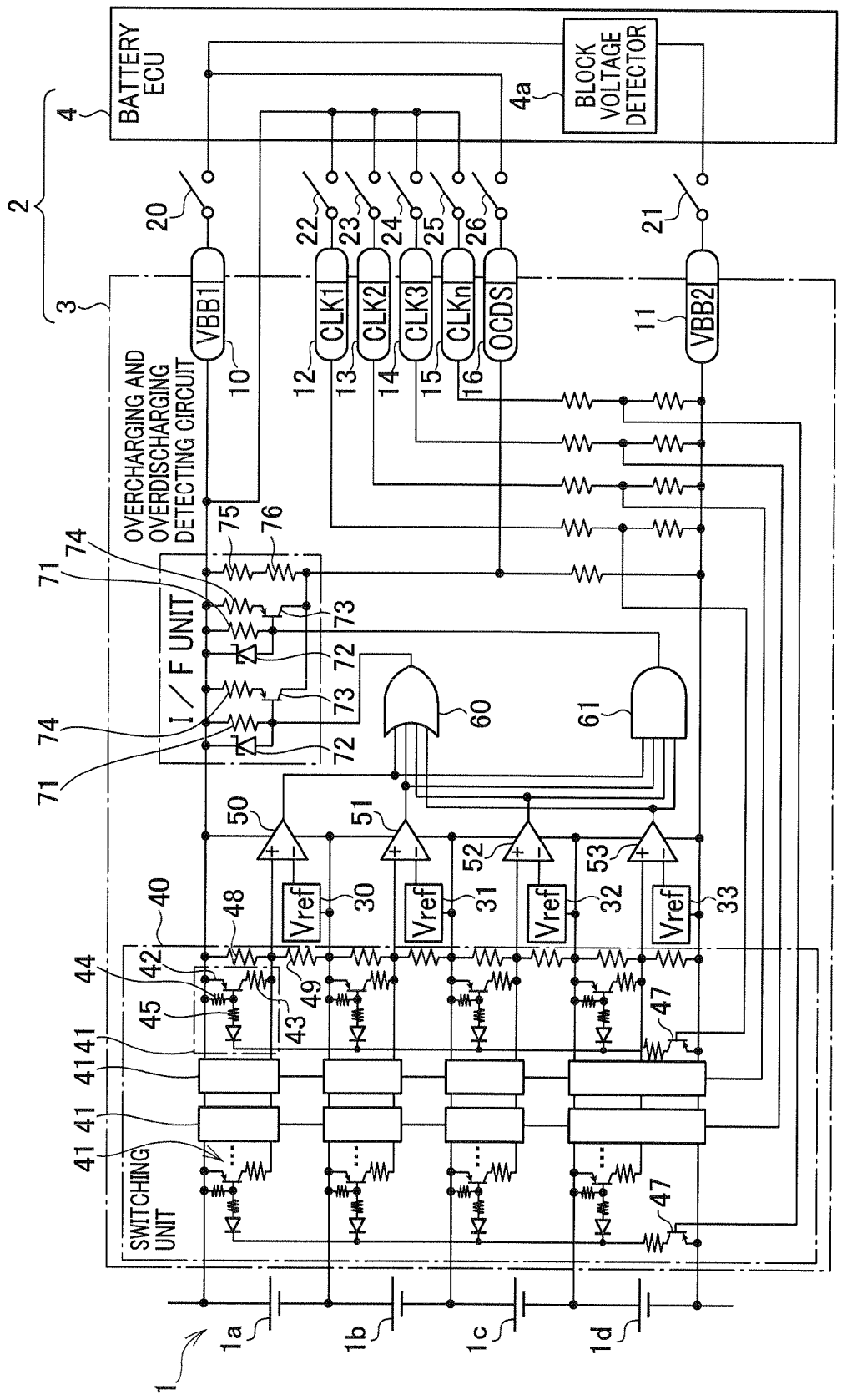
FIG. 1 is an overall structural view of a battery pack control system including a battery pack control apparatus according to the first embodiment of the present invention.

Embodiments of the present invention will be described hereinafter with reference to the drawings. In the following embodiments, identical reference characters are assigned to identical or equivalent portions.

First Embodiment

Hereinafter, the first embodiment of the present invention will be described with reference to corresponding drawings. A battery pack control apparatus according to this embodiment can be applied for monitoring an in-vehicle battery installed in for example a vehicle, such as a hybrid vehicle (HV vehicle), which can travel on at least one of drive power outputted from an internal combustion engine and drive power outputted from a driving electric motor. In addition, the battery pack control apparatus according to this embodiment can be applied for monitoring an in-vehicle battery installed in for example a vehicle, such as an electric vehicle (EV vehicle), which can travel on drive power outputted from an electric motor.

FIG. 1 is an overall structural view of battery-pack control including the battery pack control apparatus according to this embodiment. As illustrated in FIG. 1, a battery pack control system is equipped with a battery pack 1 and the battery pack control apparatus 2.

The battery pack 1 is a voltage source constructed by connecting in series a plurality of cells 1a, 1b, 1c, and 1d. Each of the cells 1a to 1d is, for example, a chargeable lithium ion secondary battery. For a hybrid vehicle as an example, the battery pack 1 is used as a power source when a motor assists an engine during acceleration of the hybrid vehicle. On the other hand, for an electric vehicle, the battery pack 1 is used as a power source of a running electric motor for generating drive power.

The battery pack control apparatus 2 is an apparatus configured to monitor the voltage at each of the cells is to 1d by comparing the voltage at each of the cells 1a to 1d with a preset value (threshold value). Because each of the cells 1a to 1d is a secondary battery, the battery pack control apparatus 2 is adapted to monitor overcharging and/or overdischarging of each of the cells 1a to 1d. The battery pack control apparatus 2 set forth above is comprised of an overcharging and overdischarging detecting circuit 3 and a battery ECU 4.

The overcharging and overdischarging detecting circuit 3 is a circuit configured to monitor the state of a block consisting of the plurality of cells 1a to 1d. In this embodiment, the four cells 1a to 1d constitute one block, and one overcharging and overdischarging detecting circuit 3 is connected with the one block.

Actually, a plurality of blocks are connected in series with each other. The overcharging and overdischarging detecting circuit 3 is connected with each of the blocks, and each of the overcharging and overdischarging detecting circuits 3 is connected with the battery ECU 4. In FIG. 1, one block in the blocks and one overcharging and overdischarging detecting circuit 3 are typically illustrated.

The overcharging and overdischarging detecting circuit 3 also inputs therein the voltage across both ends of a corresponding block, and outputs, to the battery ECU 4, the voltage across both ends of the corresponding cell. For this reason, the overcharging and overdischarging detecting circuit 3 is comprised of: a positive terminal 10 for outputting the voltage (VBB1) at the positive terminal of a corresponding block; a negative terminal 10 for outputting the voltage (VBB2) at the negative terminal of the corresponding block; and switches 20 and 21. The positive and negative terminals 10 and 11 are connected with the battery ECU 4 when the respective switches 20 and 21 provided between the overcharging and overdischarging detecting circuit 3 and the battery ECU 4 are turned on or off.

The overcharging and overdischarging detecting circuit 3 is equipped with reference voltage sources 30, 31, 32, and 33, a switching unit 40, comparators 50, 51, 52, and 53, an OR circuit 60, an AND circuit 61, and an I/F unit 70.

Each of the reference voltage sources 30 to 33 is a voltage source that generates a constant reference voltage ($V_{ref}$) relative to the potential at the negative electrode of a corresponding cells 1a to 1d. Each of the reference voltage sources 30 to 33 is connected between an inverting input terminal (−) of a corresponding one of the comparators 50 to 53 and the negative electrode of a corresponding one of the cells 1a to 1d.

The switching unit 40 is switch means configured to generate a threshold voltage corresponding to a threshold from the voltage at a corresponding one of the cells 1a to 1d. In other words, it serves to relatively change the reference voltage. The threshold voltage is outputted to a non-inverting input terminal (+) of a corresponding one of the comparators 50 to 53.

The switching unit 40 includes a plurality of voltage switching circuits 41 provided for each of the cells 1a to 1d and adapted to relatively change the reference voltage. Each of the voltage switching circuits 41 is comprised of a PNP transistor 42, resistors 43, 44, and 45, and a diode 46.

Because the structure of the voltage switching circuit 41 is common to each of the cells 1a to 1d, the structure for the cell 1a will be described.

The emitter of the transistor 42 is connected to the positive electrode of the cell 1a, and the collector thereof is connected with the non-inverting input terminal of the comparator 50 via the resistor 43. The resistor 44 is connected between the base of the transistor 42 and the positive electrode of the cell 1a, and the resistor 45 and the diode 46 are connected with the base of the transistor 42.

The diode 46 is connected with the collector of a transistor 47 provided in the switching unit 40 so as to be connected with the negative electrode of the cell 1a via the collector and the emitter of the transistor 47. The transistor 47 is common to the voltage switching circuits 41 of the respective series-connected cells 1a to 1d.

The transistor 47 is driven in response to a clock signal CLK1 inputted to a clock terminal 12 provided in the overcharging and overdischarging detecting circuit 3. Specifically, resistors 62 and 63 are connected in series with each other between the clock terminal 12 and the negative electrode of the cell 1a, and the connecting point between the resistors 62 and 63 is connected with the base of the transistor 47. The transistor 47 conducts when the clock signal CLK1 is a logical "H". Note that turning on/off a switch 22 between the overcharging and overdischarging detecting circuit 3 and the battery ECU 4 by the battery ECU 4 allows the logical "H" and a logical "L" to be generated.

The voltage switching circuit 41 set forth above is provided in plurality in the cell 1a. Resistors 48 and 49 are connected in series with each other between both ends of the cell 1a. Each of the resistors 43 of a corresponding respective voltage switching circuit 41 provided in the one cell 1a is connected with the connecting point between the corresponding resistors 48 and 49, and the connecting point is connected with the non-inverting input terminal of the comparator 50.

In addition, as described above, each of the voltage switching circuits 41 is connected with the transistor 47, and clock signals CLK1 to CLKn are respectively connected to the transistors 47. Reference character "n" corresponds to the number of voltage switching circuits 41 provided in the one cell 1a.

As well as the clock signal CLK1, the clock signals CLK2 to CLKn are inputted from the connecting points of the respective resistors 62 and 63 connected with the clock terminals 13, 14, and 15 to the bases of the respective transistors 47. Each of the clock terminals 13, 14, and 15 is connected with the battery ECU 4 via a corresponding one of the switches 23, 24, and 25. Each of the clock signals CLK2 to CLKn is generated upon a corresponding one of the switches 23, 24, and 25 being turned on/off.

As described above, the plurality of voltage switching circuits 41 are provided in the one cell 1a. When the clock signal CLK1 is, for example, switched to the logical "H", a corresponding transistor 47 conducts. This turns on a corresponding transistor 42 in the plurality of voltage switching circuits 41, resulting in a variation in potential at the connecting point of the corresponding resistors 48 and 49. This achieves the same effect as reduction in the threshold voltage to be compared with the voltage across both ends of the cell 1a.

In this embodiment, because the plurality of voltage switching circuits 41 are provided in the one cell 1a, limitation of on/off of the transistor 42 of each voltage switching circuit 41 allows a value of the threshold voltage to be stepwisely switched. The upper limit and the lower limit of the range within which the threshold voltage can be stepwisely switched show a threshold voltage indicative of overcharging and a threshold voltage indicative of overdischarging.

The structure that the plurality of voltage switching circuits 41 are provided in the one cell 1a set forth above is common to the other cells 1b to 1d.

The comparators 50 to 53 are adapted to compare the voltages at the cells 1a to 1d with the reference voltages, respectively. To the non-inverting input terminal of each of the comparators 50 to 53, the threshold voltage switched by the switching unit 40 is inputted, and, to the inverting input terminal thereof, the reference voltage of a corresponding one of the reference voltage sources 30 to 33 is inputted. Specifically, to the inverting input terminal of each of the comparators 50 to 53, the reference voltage relative to the voltage at the negative electrode of a corresponding one of the cells 1a to 1d is inputted. A predetermined divided voltage (that is, the threshold voltage) of the voltage across a corresponding one of the cells 1a to 1d is inputted to the respective non-inverting input terminal of each of the comparators 50 to 53.

The OR circuit 60 is a logic circuit that generates a logical OR signal of the respective outputs of the comparators 50 to 53. The AND circuit 61 is a logic circuit that generates a logical AND signal of the respective outputs of the comparators 50 to 53. Combinations of these logical OR and AND signals and the clock signals CLK1 to CLKn allow overcharging or overdischarging to be determined by the battery ECU 4.

Specifically, when the logical OR of the outputs of the clock signals CLK1 to the CLKn, the output of the OR circuit 60, and the output of the AND circuit 61 is the logical "H" upon detection of overcharging in which the clock signals CLK1 to CLKn are logical "L", all the cells 1a to 1d are not overcharged but normal. In addition, when the logical OR of the outputs of the clock signals CLK1 to the CLKn, the output of the OR circuit 60, and the output of the AND circuit 61 is logical "L", at least one of the cells 1a to 1d is overcharged, or any one of the switching unit 40, the reference voltages 30 to 33, and the comparators 50 to 52 is abnormal.

On the other hand, when the logical OR of the outputs of the clock signals CLK1 to the CLKn, the output of the OR circuit 60, and the output of the AND circuit 61 is the logical "L" upon detection of overdischarging in which the clock signals CLK1 to CLKn are the logical "H", all the cells 1a to 1d are not overdischarged but normal. In addition, when the logical OR of the outputs of the clock signals CLK1 to the CLKn, the output of the OR circuit 60, and the output of the AND circuit 61 is the logical "H", at least one of the cells 1a to 1d is overdischarged, or any one of the switching unit 40, the reference voltages 30 to 33, and the comparators 50 to 53 is abnormal.

The I/F unit 70 is a constant current circuit that outputs the logical OR signal and the logical AND signal to the battery ECU 4 based on the outputs of the OR circuit 60 and the AND circuit 61. The I/F unit 70 set forth above is comprised of resistors 71, diodes 72, PNP transistors 73, resistors 74, a resistor 75, and a resistor 76. The resistors 75 and 76 are connected in series with each other, and the resistor 75 is connected with the positive electrode of the block (the set of the series-connected four cells 1a to 1d).

For the OR circuit 60, one resistor 71 is connected between the output terminal of the OR circuit 60 and the positive electrode of the block, and one diode 72 is connected between the positive electrode of the block and the output terminal of the OR circuit 60.

The base of one transistor 73 is connected with the output terminal of the OR circuit 60, and the emitter of the one transistor 73 is connected with the positive electrode of the block via one resistor 74. The collector of the one transistor 73 is connected with the resistor 76.

The structure of the I/F unit 70 for the AND circuit 61 is identical to that of the I/F unit 70 for the OR circuit 60. With these structures, because the transistors 73 are turned on or off according to the output of the OR circuit or the AND circuit 61, the combined resistance of the I/F unit 70 varies.

Each resistor 76 of the I/F unit 70 is connected with the negative electrode of the block via a resistor 64 provided in the overcharging and overdischarging detecting circuit 3, and the connecting point between the resistors 76 and 64 is connected with an output terminal 16 provided in the overcharging and overdischarging detecting circuit 3. The output terminal 16 is connected with the battery ECU 4 upon on/off of a switch 26 provided between the overcharging and overdischarging detecting circuit 3 and the battery ECU 4. This takes the logical OR signal or the logical AND signal outputted from the I/F unit 70 as the output (OCDS) of the overcharging and overdischarging detecting circuit 3, to be inputted to the battery ECU 4.

The battery ECU 4 has a function of determining the state of the battery pack 1 based on compared results outputted from the comparators 50 to 53. Specifically, the battery ECU 4 determines whether the voltage at each of the cells 1a to 1d is within a constant voltage range based on logical combinations of the output (OCDS) of the overcharging and overdischarging detecting circuit 3 and the clock signals CLK1 to CLKn. This results in that the battery ECU 4 detects overcharging or overdischarging of the cells 1a to 1d, thus determining the state of the battery pack 1.

The battery ECU 4 also has a function of detecting whether there is a spontaneous change in the reference voltages based on: the voltages at the cells 1a to 1d detected by a block voltage detector 4a; and the outputs of the comparators 50 to 53 when the reference voltages are stepwisely changed by the plurality of voltage switching circuits 41. For this reason, the battery ECU 4 is provided with the block voltage detector 4a.

The block voltage detector 4a is adapted to measure the voltage across the block, that is, the voltage across the series-connected four cells 1a to 1d. For this reason, the block voltage detector 4a is connected with a positive-electrode terminal 10 via the switch 20, and connected with a negative-electrode terminal 11 via the switch 21. The block voltage detector 4a also divides the voltage across the block by the number of the cells 1a to 1d to thereby obtain an average of the voltage at one cell. Such estimated values of the cells 1a to 1d are used for detection of the spontaneous change of each of the reference voltages in the switching unit 40.

Specifically, the battery ECU 4 detects the spontaneous change of the reference voltages in the following procedure. First, the block voltage detector 4a detects the voltage across the block. The battery ECU 4 also obtains the outputs of the comparators 50 to 53 when switching the voltage switching circuits 41 of the switching unit 40 to relatively change the reference voltages. That is, the battery ECU 4 obtains the outputs of the OR circuit 60 and the AND circuit 61.

Thereafter, the battery ECU 4 compares a result of the comparison between an estimated value of each of the cells 1a to 1d detected by the block voltage detector 4a and a corresponding reference voltage with a result of the comparison by the overcharging and overdischarging detecting circuit 3 upon a corresponding reference voltage being stepwisely changed to plural levels by the plurality of voltage switching circuits 41 (that is, the outputs of the OR circuit 60 and the AND circuit 61). As a result it is determined that there are no abnormalities when the corresponding compared results are matched with each other, or that there is a spontaneous change in a corresponding reference voltage when the corresponding compared results are mismatched with each other.

The battery ECU 4 set forth above is equipped with a microcomputer including a CPU, a ROM, an EEPROM, a RAM, and so on (not shown). In accordance with programs stored in the microcomputer, the battery ECU 4 monitors overcharging or overdischarging of each of the cells 1a to 1d of the block, and detects the spontaneous change in the reference voltages.

Such is the overall structure of the battery pack control system and the battery pack control apparatus 2 according to this embodiment.

Next, the number of the voltage switching circuits 41 for each of the cells 1a to 1d will be described with reference to FIGS. 2 and 3.

Figure 2:
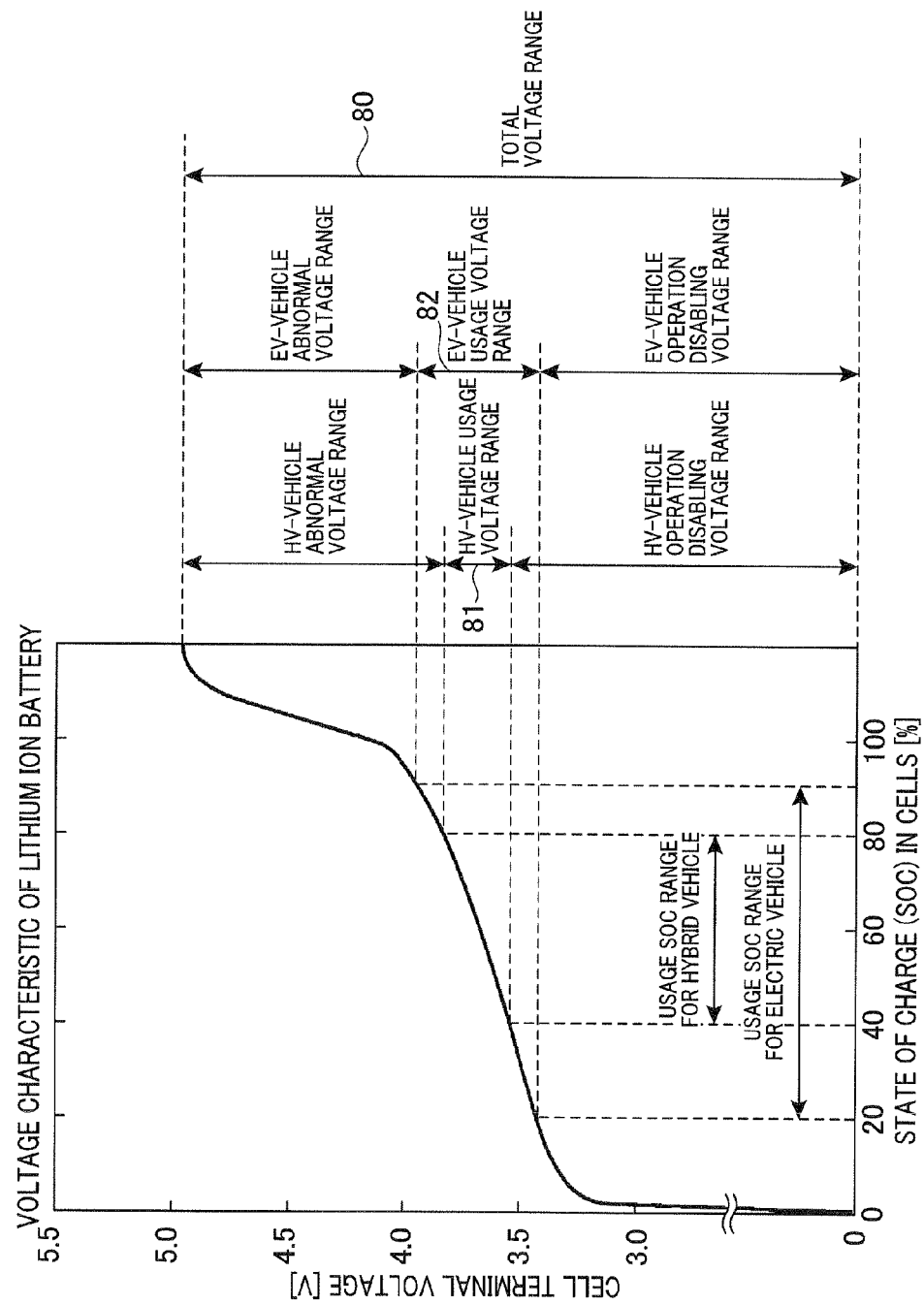
FIG. 2 is a view illustrating a voltage characteristic of a lithium ion battery.
Figure 3:
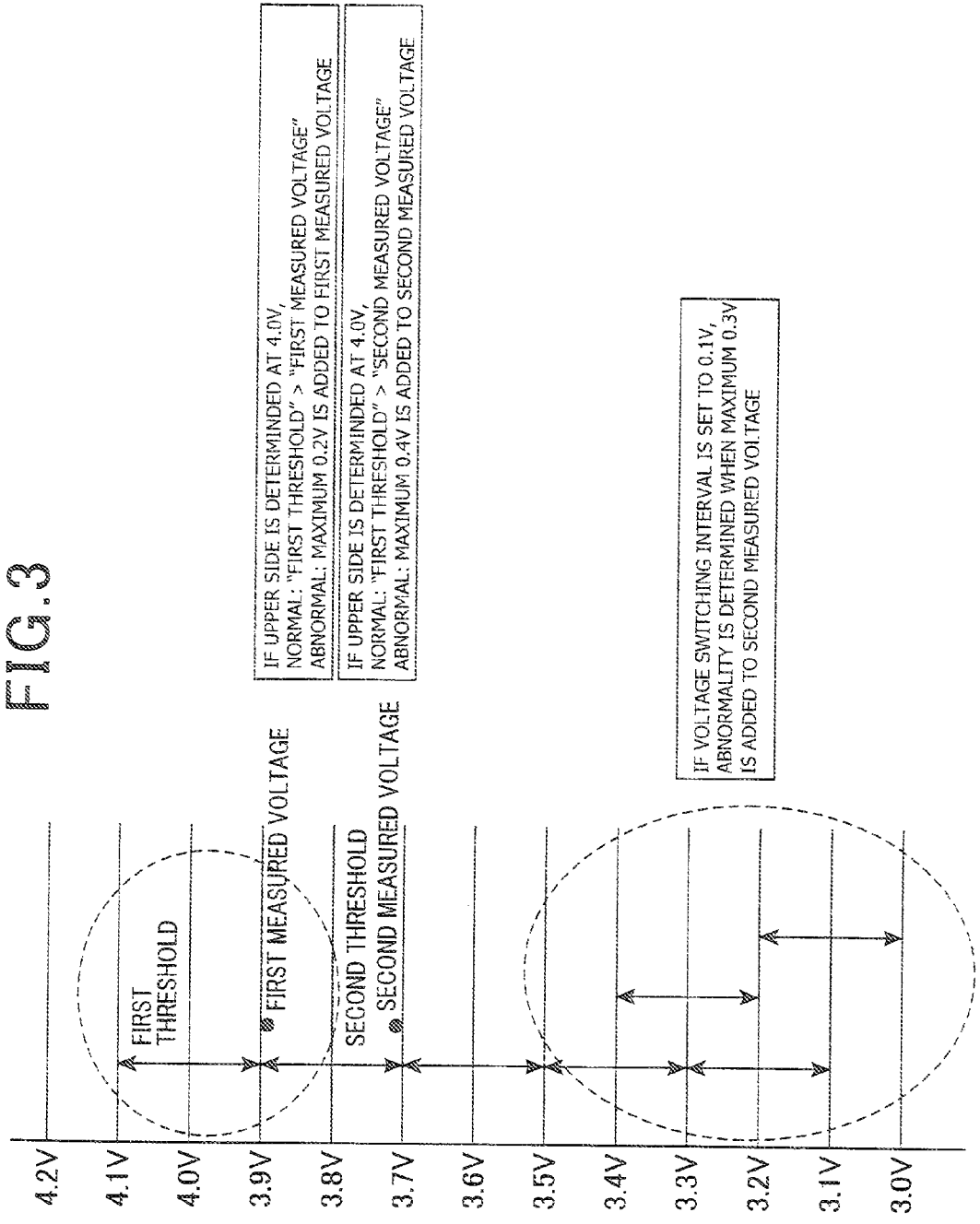
FIG. 3 is a view illustrating the number of voltage switching circuits.

FIG. 2 is a view illustrating a voltage characteristic of a lithium ion battery. The horizontal axis represents the state of charge (SOC) in the cells 1a to 1d, and the vertical axis represents a cell terminal voltage (a voltage across both ends of one cell). FIG. 3 is a view illustrating the number of the voltage switching circuits 41.

Here, the fact that the SOC is 100% means that the one cell is fully charged.

As illustrated in FIG. 2, the voltage characteristic of the lithium ion battery shows that the cell terminal voltage rises sharply up to the order of 3.3 V until the SOC reaches a few percentages from 0%. The cell terminal voltage rises at a constant percentage of rise until the SOC reaches 100% from a few percentages, and rises at a greater percentage of rise compared to the constant percentage of rise after the SOC exceeds 100% until it reaches the order of 120%. The cell terminal voltage becomes the order of 5.0 V when the SOC is 120%.

In the voltage characteristic of the lithium ion battery, the total voltage range 80 of the lithium ion battery is the range from the minimum voltage to the maximum voltage. For this reason, the total voltage range 80 of the lithium ion battery is the range from 0 V to 5.0 V. Specifically, the total voltage range 80 of each of the cells 1a to 1d is the range from 0 V to 5.0 V, which corresponds to the range of the SOC from 0% to 120%.

The battery pack 1 is to be installed in for example, a hybrid vehicle or an electric vehicle. Each of usage voltage ranges 81 and 82 corresponding to the total voltage range 80 is determined depending on a corresponding one of a hybrid vehicle and an electric vehicle. Specifically, a part of the total voltage range of 0 to 5.0 V of each of the cells 1a to 1d is used.

Each of the usage voltage ranges 81 and 82 is a voltage range to be used by each of the cells 1a to 1d within the total voltage range 80. Each of the usage voltage ranges 81 and 82 is determined with a voltage having a highest frequency being centered. This allows overcharging and overdischarging relative to the highest frequently used voltage to be properly determined.

Specifically, when the battery pack 1 is installed in a hybrid vehicle, the usage voltage range 81 to be used for each of the cells 1a to 1d is, for example, the range with 60%±20% of the fully charged voltage of each cell (see FIG. 2). That is, the usage voltage range 81 of each of the cells 1a to 1d in a hybrid vehicle corresponds to a cell-terminal voltage range equivalent to the range of the SOC from 40% to 80%. The cell-terminal voltage range is for example from 3.6 V to 3.8 V.

For hybrid vehicles, the SOC corresponding to the highest frequently used voltage within the total voltage range 80 is 60%, it is preferable that the usage voltage range 81 is limited to the range with 60%±20% of the fully charged voltage of each cell, and further limited to ±10% in accordance with frequent use.

On the other hand, when the battery pack 1 is installed in an electric vehicle, the usage voltage range 82 to be used for each of the cells 1a to 1d is, for example, the range from 20% to 90% of the fully charged voltage of each cell (see FIG. 2). That is, the usage voltage range 82 of each of the cells 1a to 1d in an electric vehicle corresponds to a cell-terminal voltage range equivalent to the range of the SOC from 20% to 90%.

For electric vehicles, the SOC corresponding to the highest frequently used voltage within the total voltage range 80 is 80%, it is preferable that the usage voltage range 82 is limited to the range from 80% to 40% of the fully charged voltage of each cell (0% to −40% with respect to 80%). The usage voltage range 82 is for example from 3.5 V to 4.0 V. The usage voltage range 82 can be further limited to be equal to or lower than 40%, such as 20%.

In addition, when the voltage at each of the cells 1a to 1d exceeds any of the usage voltage ranges R1 and R2, the voltage is assumed to be an abnormal voltage. When the voltage at each of the cells 1a to 1d falls below any of the usage voltage ranges 81 and 82, the voltage is taken as an operation disabling voltage.

The range of relative change in the reference voltage by the plurality of voltage switching circuits 41 is defined within a part (the usage voltage range 81 or 82) of the total voltage range 80 of a corresponding one of the cells 1a to 1d. The range of relative change in the reference voltage is set such that the upper limit is set to a voltage indicative of the overcharging of a corresponding one of the cells 1a to 1d, and the lower limit is set to a voltage indicative of the overdischarging of the corresponding one of the cells 1a to 1d.

In other words, the plurality of voltage switching circuits 41 are located to meet a part of the total voltage range 80, that is, the usage voltage range 81 or 82, and the number of the voltage switching circuits 41 is set to a number meeting the usage voltage range 81 or 82.

As a result, when the switching interval of voltage within the total voltage range 80, that is, the range from 0 V to 5.0 V is 0.2 V, twenty-five voltage switching circuits 41 are required. However, when each of the voltage usage ranges 81 and 82 is set to the range from 3.1 V to 4.1 V, this range requires no more than five voltage switching circuits 41. Limiting relative change in the reference voltage to the usage voltage range 81 or 82 allows the voltage switching circuits 41 in number and size to be reduced.

Note that the number of the voltage switching circuits 41 can be set in consideration of the accuracy of switching of the overcharging and overdischarging detection threshold values by the switching unit 40. Assuming that the voltage switching accuracy of one voltage switching circuit 41 is ±3%, which is equal to the range from 0.97 V to 1.02 V, it is ±0.12 V when the overcharging threshold value is set to 4.0 V. Thus, setting the voltage switching circuits 41 at 0.24 (≈0.2 V) intervals allows each of the usage voltage ranges 81 and 82 to be exhaustively covered. Specifically, as illustrated in FIG. 3, 4.0 V±0.2 V, 3.8 V±0.2 V, 3.6 V±0.2 V, 3.4 V±0.2 V, and 3.2 V±0.2 V are obtained.

For example, if upper side (overcharging) is determined at 4.0 V, when a first determination voltage is higher than a first measured voltage, it is normal (see FIG. 3), but when a maximum 0.2 V is added to the first measured voltage, it is abnormal. Similarly, when a first determination voltage is higher than a second measured voltage, it is normal (see FIG. 3), but when a maximum 0.4 V is added to the second measured voltage, it is abnormal. Thus, the reference voltage may be shifted up to 0.4 V.

The upper limit of the voltage shift width by the voltage switching circuits 41 becomes 4.4 V when the usage upper limit 4.0 V is shifted by 0.4 V, which reduces the abnormality detection capability. Thus, setting the voltage switching intervals to 0.1 V causes abnormality determination to be set to the sum of the second measured voltage and the maximum 0.3 V, restricting abnormality determination up to 4.3 V at the usage upper limit of 4.0 V.

Figure 4:
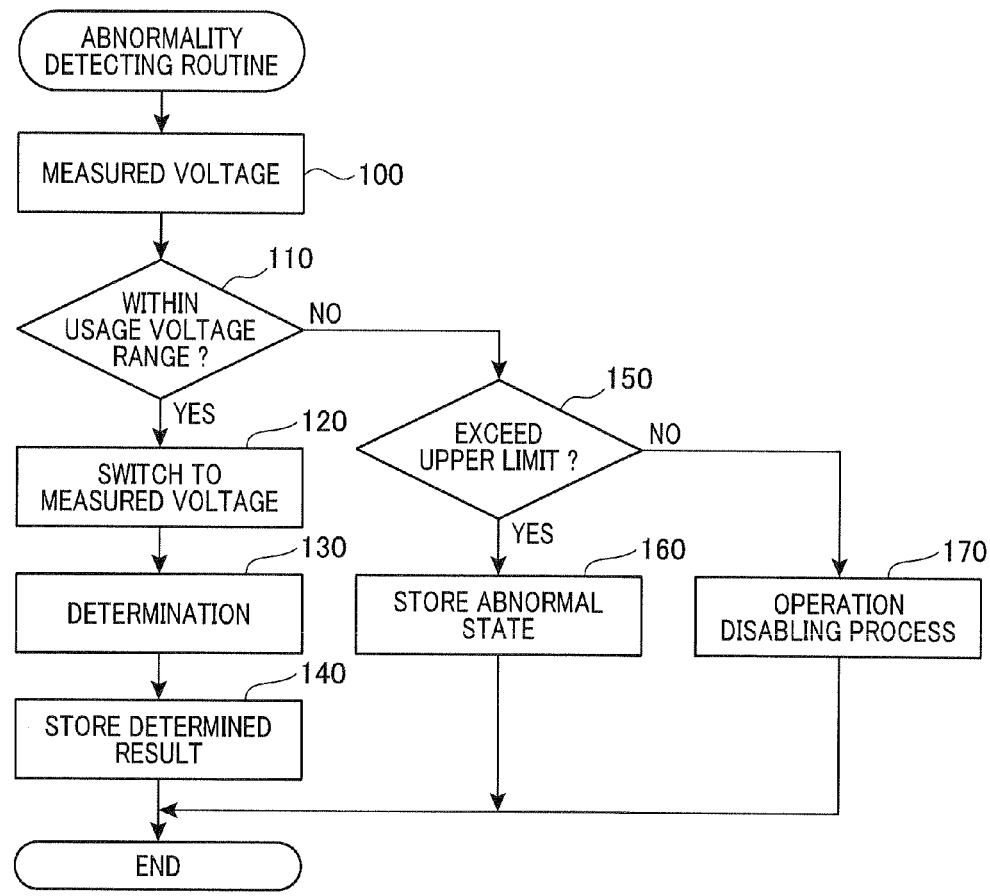
FIG. 4 is a flowchart illustrating an abnormality detecting routine to detect overcharging.

Next, operations of the battery ECU 4 for abnormality detection will be described with reference to FIG. 4. FIG. 4 is a flowchart illustrating an abnormality detecting routine to detect overcharging or overdischarging. Running a program stored in the battery ECU 4 performs the abnormality detecting routine. Note that the abnormality detecting routine is started when the battery ECU 4 is powered on or off, or receives an external instruction.

When the flowchart is launched, in step 100, voltage measurement is carried out. Specifically, while the corresponding threshold voltage is stepwisely switched according to the input of the clock signals CLK1 to CLKn to each voltage switching circuit 41, the output (OCDS) of the overcharging and overdischarging detecting circuit 3 is inputted to the battery ECU 4.

In step 110, whether the voltage at each of the cells 1a to 1d is within the corresponding usage voltage range 81 or 82 is determined based on the output (OCDS) obtained in step 100 and the clock signals CLK1 to CLKn. In other words, whether each of the cells 1a to 1d is overcharged or overdischarged, or is normal is determined. When it is determined that the voltage at the cell 1a, 1b, 1c, or 1d is not within the corresponding usage voltage range 81 or 82, that is, the cell 1a, 1b, 1c, or 1d is overcharged or overdischarged, the routine proceeds to step 150. Otherwise, when it is determined that the voltage at each of the cells 1a to 1d is within the corresponding usage voltage range 81 or 82, the routine proceeds to step 120.

Steps 120 to 140 are operations to detect the spontaneous change of each reference voltage. First, in step 120, switch to a measured voltage is performed. Specifically, the voltage across the block of the cells 1a to 1d is measured by the block voltage detector 4a, and an estimated value of one cell and the corresponding reference voltage are compared in magnitude with each other.

In step 130, determination is performed. Specifically, whether the respective compared results are matched with each other is determined. When the respective compared results are matched with each other, it is determined that there are no abnormalities. Otherwise, when the respective compared results are mismatched with each other, it is determined that the spontaneous change of a reference voltage occurs.

In step 140, the result of the determination in step 130 is stored, and thereafter, the abnormality detecting routine is terminated.

Steps 150 to 170 are operations when the voltage at the cell 1a, 1b, 1c, or 1d is abnormal. In step 150, it is determined whether the voltage, which has been determined out of the usage voltage range 81 or 82 in step 110, exceeds the upper limit of the usage voltage range 81 or 82, that is, the overcharging threshold voltage. In this step, when the voltage exceeds the upper limit of the usage voltage range 81 or 82, the routine proceeds to step 160. Otherwise, when the voltage does not exceed the upper limit of the usage voltage range 81 or 82, the routine proceeds to step 170.

In step 160, when the voltage exceeds the upper limit of the usage voltage range 81 or 82 in step 150, that is, the voltage at the cell 1a, 1b, 1c, or 1d exceeds the upper limit of the range of relative change in the corresponding reference voltage, the corresponding cell 1a, 1b, 1c, or 1d becomes overcharged. Then, this abnormal state is stored.

On the other hand, in step 170, when the voltage does not exceed the upper limit of the usage voltage range 81 or 82 in step 150, that is, the voltage at the cell 1a, 1b, 1c, or 1d falls below the lower limit of the range of relative change in the corresponding reference voltage, an operation disabling process to disable the operation of the corresponding cell 1a, 1b, 1c, or 1d is performed, and thereafter, the abnormality detecting routine is terminated.

As described above, in this embodiment, the switching unit 40 is characterized to comprise the plurality of voltage switching circuits 41, and to detect the spontaneous change of a corresponding reference voltage while relatively changing stepwise the corresponding reference voltage to plural levels. This makes it possible to more finely divide the corresponding reference voltage in comparison to the case where the reference voltage is shifted by one step to detect the spontaneous change of the reference voltage. This results in an improvement of the accuracy of determining the spontaneous change of a reference voltage.

The improvement of the accuracy of determining the spontaneous change of a reference voltage allows the spontaneous change of a reference voltage in the battery pack 1 to be reliably determined; this battery pack 1 is to be used for hybrid vehicles or electric vehicles, which require safety and reliability.

In addition, the range of relative change in a reference voltage by the plurality of voltage switching circuits 41 is characterized to be set within the usage voltage range 81 or 82 as a part of the total voltage range of each of the cells 1a to 1d. This eliminates the need to provide voltage switching circuits 41 required to relatively change the reference voltage over the total voltage range of each of the cells 1a to 1d, making it possible to minimize the number of the voltage switching circuits 41 for each of the cells 1a to 1d. Thus, it is possible to prevent the size of the battery pack control apparatus 2 from increasing.

In addition, it is determined whether or not each of the cells 1a to 1d is overcharged or overdischarged. When a cell 1a, 1b, 1c, or 1d is determined to be overcharged, abnormality determination is performed to prevent the failure of the cell 1a, 1b, 1c, or 1d due to its overcharging, thus improving the safety of the cells 1a to 1d. On the other hand, when a cell 1a, 1b, 1c, or 1d is determined to be overdischarged, the operation of the corresponding cell 1a, 1b, 1c, or 1d is stopped. This prevents further discharging of the corresponding cell 1a, 1b, 1c, or 1d, thus improving the reliability of the cells 1a to 1d.

Note that, for correspondence between the descriptions of this embodiment and the descriptions of claims later, the block voltage detector 4a corresponds to a "voltage detecting means" recited in the claims, and the reference voltage sources 30 to 33 correspond to a "reference voltage generating means" recited in the claims. In addition, the comparators 50 to 53, the OR circuit 60, and the AND circuit 61 correspond to a "voltage comparing means" recited in the claims, and the battery ECU 4 corresponds to a "determining means" recited in the claims. Moreover, the switching unit 40 corresponds to a "switching means" recited in the claims.

Second Embodiment

In this embodiment, portions different from the first embodiment will be only described. In this embodiment, a plurality of overcharging and overdischarging circuits 3 are provided in one block.

Figure 5:
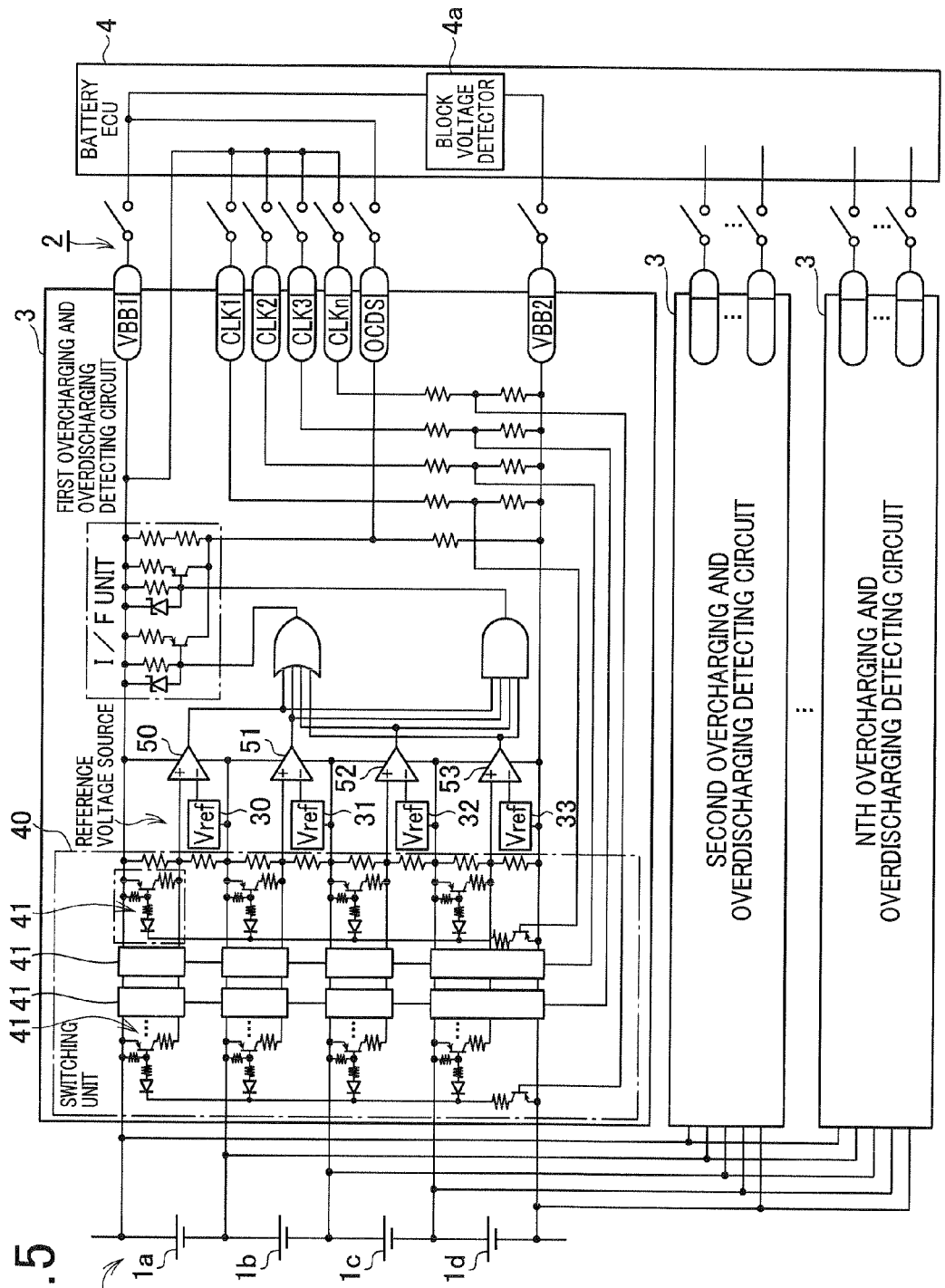
FIG. 5 is an overall structural view of a battery pack control system including a battery pack control apparatus according to the second embodiment of the present invention.

FIG. 5 is an overall structural view of a battery-pack control system including a battery pack control apparatus 2 according to this embodiment. As illustrated in FIG. 1, the N number of first to Nth overcharging and overdischarging detecting circuits 3 are provided in one block. Specifically, for one cell in the plurality of cells 1a to 1d, plural sets of the reference voltage sources 30 to 33, the comparators 50 to 53, and the switching unit 40 are provided.

Thus, in the battery ECU 4, overcharging and overdischarging is detected based on the detected result of each of the overcharging and overdischarging detecting circuits 3, and the respective results of the overdischarging detecting circuits 3 are mutually compared with each other. Note that the block voltage detector 4a can be provided in plurality corresponding to the plurality of overcharging and overdischarging detecting circuits 3.

The aforementioned configuration allows overdischarging of each cell 1a to 1d to be monitored by the plurality of overcharging and overdischarging circuits 3. For this reason, it is possible to enhance the redundancy of overcharging and overdischarging detection of each of the cells 1a to 1d. In addition, even if the spontaneous change in a reference voltage occurs in any of the overcharging and overdischarging detecting circuits 3, using the results of the other overcharging and overdischarging detecting circuits 3 allows voltage monitoring to be continued.

Even if the plurality of switching units 40 are provided for each of the cells 1a to 1d, the range of relative change of a corresponding reference voltage by the plurality of voltage switching circuits 41 is set in the usage voltage range 81 or 82 as a part of the total voltage range of a corresponding one of the cells 1a to 1d in one overcharging and overdischarging detecting circuit 3. For this reason, the number of the voltage switching circuits 41 to be provided in the switching unit 40 of each of the overcharging and overdischarging detecting circuits 3 is minimized. Thus, it is possible to prevent the scale of the battery pack control apparatus 2 from increasing.

Other Embodiments

In each of the first and second embodiments, a lithium ion secondary battery used for each of the cells 1a to 1d constituting the battery pack 1 has been described as an example, but another type of secondary batteries can be used. The battery pack 1 need not be installed in hybrid vehicles or electric vehicles. In other words, the battery pack 1 need not be installed in vehicles.

In each of the first and second embodiments, the block voltage detector 4a is adapted to measure the voltage across one block, but can be adapted to measure the voltage of one cell 1a.

The circuit structure of the overcharging and overdischarging circuit 3 shown in each of the first and second embodiments is an example, and another circuit structure can be used.

In each of the first and second embodiments, the battery pack 1 is used as a power source for hybrid vehicles or electric vehicles, but can be used as a battery for plug-in hybrids. In this case, the usage voltage range can be set to a range between the usage voltage range 81 for hybrid vehicles and the usage voltage range 82 for electric vehicles.

DESCRIPTION OF CHARACTERS

1 Battery pack
1a to 1d Cell
4a Block voltage detector (voltage detecting means)

30 to 33 Reference voltage source (reference voltage generating means)
50 to 53 Comparator (voltage comparing means)
60 OR circuit (voltage comparing means)
61 AND circuit (Voltage comparing means)
41 Voltage switching circuit
40 Switching unit (switching means)
4 Battery ECU (determining means)
80 Total voltage range of cell
81 Usage voltage range for hybrid vehicles
82 Usage voltage range for electric vehicles

The invention claimed is:

1. A battery pack control apparatus for monitoring a voltage of a plurality of series-connected cells constituting a battery pack, the battery pack control apparatus comprising:
a voltage detecting means that detects a voltage of at least one cell in the plurality of cells;
a reference voltage generating means that generates a reference voltage;
a voltage comparing means that compares the voltage of the at least one cell with the reference voltage;
a switching means comprising a plurality of voltage switching circuits that relatively change the reference voltage; and
a determining means that:
determines a state of the battery pack based on a result of the comparison outputted from the voltage comparing means; and
determines whether there is a spontaneous change of the reference voltage based on: a result of the comparison between the voltage of the at least one cell detected by the voltage detecting means and the reference voltage; and a result of the comparison by the voltage comparing means while the reference voltage is relatively changed stepwisely by the plurality of voltage switching circuits,
wherein a range of relative change in the reference voltage by the plurality of switching circuits is set to a usage voltage range to be used by the at least one cell within a total voltage range of the at least one cell, the total voltage range being defined from a minimum voltage to a maximum voltage of the at least one cell, and
the determining means detects the spontaneous change of the reference voltage based on respective results of comparisons between plural levels of the reference voltage stepwisely switched by the plurality of voltage switching circuits and the voltage of the at least one cell.

2. The battery pack control apparatus according to claim 1, wherein the range of the relative change in the reference voltage has an upper limit, the upper limit being set to a voltage indicative of overcharging of the at least one cell, and
the determining means carries out abnormality determination that the at least one cell is overcharged when the voltage of the at least one cell exceeds the upper limit of the range of the relative change in the reference voltage.

3. The battery pack control apparatus according to claim 1, wherein the range of the relative change in the reference voltage has a lower limit, the lower limit being set to a voltage indicative of overdischarging of the at least one cell, and
the determining means stops an operation of the at least one cell when determining that the voltage of the at least one cell falls below the lower limit of the range of the relative change in the reference voltage.

4. The battery pack control apparatus according to claim 1, wherein, when the reference voltage generating means, the voltage comparing means, and the switching means constitute an overcharging and overdischarging detecting circuit, the overcharging and overdischarging detecting circuit is provided in plurality for each of the plurality of cells.

5. The battery pack control apparatus according to claim 1, wherein the usage voltage range is a range determined within the total voltage range, the range having a voltage with a highest frequency of use being centered.

6. The battery pack control apparatus according to claim 1, wherein each of the cells is installed in a vehicle able to travel on at least one of drive power outputted from an internal combustion engine and drive power outputted from a driving electric motor, and
the usage voltage range to be used by the at least one cell is a range centered on 60% of a fully charged voltage of the at least one cell.

7. The battery pack control apparatus according to claim 1, wherein each of the cells is installed in a vehicle able to travel on drive power outputted from a driving electric motor, and
the usage voltage range to be used by the at least one cell is a range with an upper limit of 80% of a fully charged voltage of the at least one cell.

8. The battery pack control apparatus according to claim 2, wherein the range of the relative change in the reference voltage has a lower limit, the lower limit being set to a voltage indicative of overdischarging of the at least one cell, and
the determining means stops an operation of the at least one cell when determining that the voltage of the at least one cell falls below the lower limit of the range of the relative change in the reference voltage.

9. The battery pack control apparatus according to claim 2, wherein, when the reference voltage generating means, the voltage comparing means, and the switching means constitute an overcharging and overdischarging detecting circuit, the overcharging and overdischarging detecting circuit is provided in plurality for each of the plurality of cells.

10. The battery pack control apparatus according to claim 3, wherein, when the reference voltage generating means, the voltage comparing means, and the switching means constitute an overcharging and overdischarging detecting circuit, the overcharging and overdischarging detecting circuit is provided in plurality for each of the plurality of cells.

11. The battery pack control apparatus according to claim 2, wherein the usage voltage range is a range determined within the total voltage range, the range having a voltage with a highest frequency of use being centered.

12. The battery pack control apparatus according to claim 3, wherein the usage voltage range is a range determined within the total voltage range, the range having a voltage with a highest frequency of use being centered.

13. The battery pack control apparatus according to claim 4, wherein the usage voltage range is a range determined within the total voltage range, the range having a voltage with a highest frequency of use being centered.

14. The battery pack control apparatus according to claim 2, wherein each of the cells is installed in a vehicle able to travel on at least one of drive power outputted from an internal combustion engine and drive power outputted from a driving electric motor, and
the usage voltage range to be used by the at least one cell is a range centered on 60% of a fully charged voltage of the at least one cell.

15. The battery pack control apparatus according to claim 3, wherein each of the cells is installed in a vehicle able to travel on at least one of drive power outputted from an internal combustion engine and drive power outputted from a driving electric motor, and the usage voltage range to be used by the at least one cell is a range centered on 60% of a fully charged voltage of the at least one cell.

16. The battery pack control apparatus according to claim 2, wherein each of the cells is installed in a vehicle able to travel on drive power outputted from a driving electric motor, and the usage voltage range to be used by the at least one cell is a range with an upper limit of 80% of a fully charged voltage of the at least one cell.

17. The battery pack control apparatus according to claim 3, wherein each of the cells is installed in a vehicle able to travel on drive power outputted from a driving electric motor, and the usage voltage range to be used by the at least one cell is a range with an upper limit of 80% of a fully charged voltage of the at least one cell.

* * * * *